United States Patent [19]

Schubert

[11] Patent Number: 4,788,492
[45] Date of Patent: Nov. 29, 1988

[54] LOGIC ANALYZER

[75] Inventor: Wolfgang Schubert, Munich, Fed. Rep. of Germany

[73] Assignee: Rohde & Schwarz GmbH & Co KG, Fed. Rep. of Germany

[21] Appl. No.: 19,366

[22] Filed: Feb. 26, 1987

[30] Foreign Application Priority Data

Apr. 9, 1986 [DE] Fed. Rep. of Germany ....... 3611872

[51] Int. Cl.⁴ .................... G01R 31/28; G01R 15/00
[52] U.S. Cl. ........................... 324/73 R; 324/73 AT; 324/158 R; 371/15; 371/16
[58] Field of Search ........... 324/73 R, 73 AT, 158 R; 371/20, 25, 15, 16

[56] References Cited

U.S. PATENT DOCUMENTS 4,654,848  3/1987  Noguchi ..................... 324/73 R X
4,697,138  9/1987  Morishita et al. ............ 324/73 R X
4,701,918  10/1987 Nakajima et al. .............. 371/20 X

FOREIGN PATENT DOCUMENTS 3149460  6/1983  Fed. Rep. of Germany .

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

A logic analyzer has a plurality of data channels and clock channels which are connectible to a digital circuit. Each clock channel has associated therewith a temporary memory connected to all of the data channels, and the data stored in the temporary memories are successively delivered to a data memory under the control of master clock signals.

3 Claims, 1 Drawing Sheet

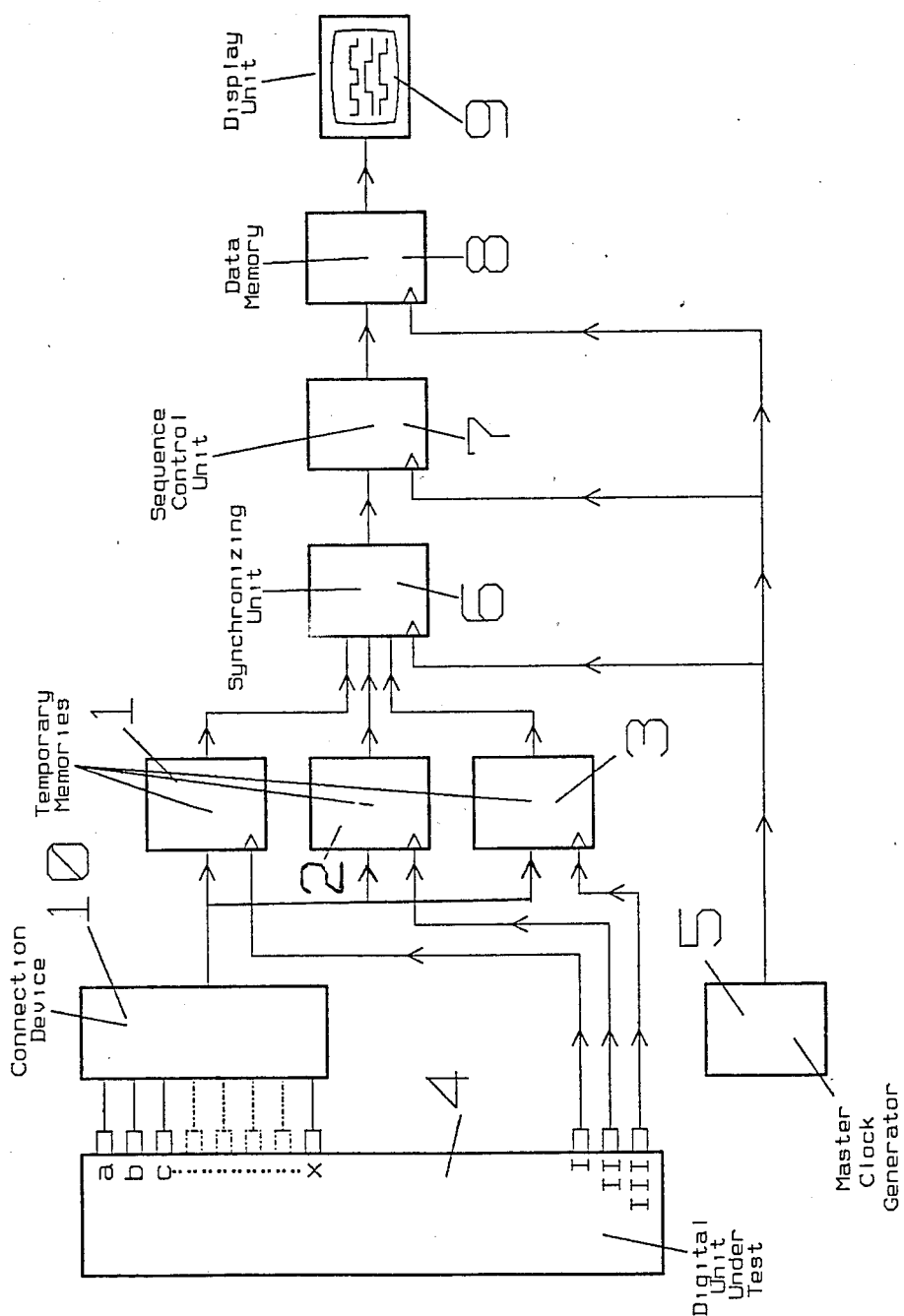

LOGIC ANALYZER

BACKGROUND OF THE INVENTION

1. Field of the Invention

The present invention is directed to a logic analyzer for representing a data of digital circuits.

2. Description of the Prior Art

Logic analyzers of the type generally set forth above are known, German Pat. No. 3,149,460, in which, by way of clock channels, a plurality of clock signals is respectively derived from the digital unit under test, the clock signal determining the sampling time for the data which are likewise derived from the digital unit via the data channels. When it is desired to analyze plural, independent processes which are executed without any correlation in terms of time, as would be the case, for example, with multi-processor systems, it is not readily possible to connect some of the clock channels to the one process and other clock channels to the other process, because with an approximate simultaneity of clock signals, one of the clock signals will never be recognized by the logic analyzer so that the storing of the data channel data clocked by that clock signal will not be effected.

It has already been attempted to solve this problem for two mutually-independent processes by two separate logic analyzers, wherein each logic analyzer additionally records correlation bits at the same time the other logic analyzer records a data pattern. In this connection, reference is taken to the Tektronix 1240 dual timebase logic analyzer. In this analyzer, evolution of the stored data is relatively complex because the correlation between the two separate recordings must also be analyzed. Above all, however, the known principle can be used with only two processes, since apparatus expense would be unacceptably high for more than two processes.

SUMMARY OF THE INVENTION

It is therefore the object of the present invention to provide a logic analyzer of simple construction, in which, even with simultaneous or approximately simultaneous occurrence of clock signals in the clock channels, all data of the data channels are sampled without any data losses and are stored in a data memory.

The above object is achieved in a logic analyzer, according to the present invention, in that all data of the data channels are temporarily stored in relation to each specific clock channel, i.e. with each occurring external clock signal of the digital circuit under test the logic state of all data channels are stored in associated temporary memories where they remain until transferred to a data memory with a master clock. Simultaneously-occurring clock signals, or clock signals occurring in rapid succession approximately simultaneously within the master clock, will therefore no longer result in loss of data. In accordance with a further feature of the invention, it is particularly preferred that the respective residence time of the data in the various temporary memories until transfer thereof to the data memory is determined and is appended in binary-encoded form to the data which are stored in the data memory. In this manner, it is possible upon analysis of the data stored in the data memory following termination of the measurement to reconstruct the simultaneity of approximate simultaneity of the clock signals and analyze the same accordingly. The advantageous characteristic of a logic analyzer according to the present invention may be obtained with little design effort by the mere addition of a few simple temporary memories.

BRIEF DESCRIPTION OF THE DRAWING

Other objects, features and advantages of the invention, will be best understood from the following detailed description taken in conjunction with the accompanying drawing, on which there is a single figure showing a schematic circuit diagram of a logic analyzer constructed in accordance with the present invention.

DESCRIPTION OF THE PREFERRED EMBODIMENT

The drawing is a schematic circuit diagram of a logic analyzer constructed in accordance with the invention, for testing and displaying the data of a digital unit 4 under test. The logic analyzer comprises a plurality of data channels a, b, c . . . x adapted to be connected via respective probes to predetermined measuring points of the unit 4 under test. In addition to the data channels a--x, several clock channels I, II and III are provided. Only three such clock channels are illustrated in the instant embodiment for the sake of simplicity, and a plurality of such clock channels may be provided, as required. These clock channels may likewise be connected by way of respective probes to the unit 4 under test, whereby it is possible at predetermined circuit points of the unit under test to derive respective external clock signals by way of which the sampling time for the data fetched via the data channels is established. A plurality of temporary memories, 1, 2 and 3 are assigned to the respective clock channels I, II and III and all data of the data channels a---x are simultaneously applied to the inputs of the temporary memories 1, 2, 3. The outputs of the temporary memories are connected to a synchronizing unit 6 which leads to the regular sequence control unit 7 of the logic analyzer through which the data are stored in a manner known per se in a data memory 8 so that the data may be displayed to a user by a display unit 9 and may be analyzed. Control of the synchronizing unit 6 and of the sequence control unit and the display unit 9 of the logic analyzer proper is effected via an external fixed master clock of a master clock generator 5. The master clock frequency is, for example, 20 MHz, which means that every 50 ns data are transmitted and processed in the analyzer.

Upon occurrence of an external clock signal in one of the clock channels I, II or III, the data from the data channel a--x are stored in the respective associated temporary memory 1, 2 or 3, depending on which clock channel triggers the storing operation. A storing operation triggered by the clock channel I therefore stores the data from the data channels a--x in the temporary memory 1, the storing of data triggered by the clock channel II occurs in the temporary memory 2, etc. If required, various numbers of clock channels with their associated temporary memories may be provided. Following storage of the data in the temporary memory 1, 2 or 3, the respective temporary memory sets a request signal for the synchronizing unit 6, which at the next-possible master clock cycle retrieves the data from the temporary memory and releases the same for a fresh storing operation. If the successive clock signals occur at an internal in excess of the maximum master clock (e.g. 50 ns), the data stored in the temporary memory will immediately be supplied via the synchronizing unit 6 and the sequence control unit 7 to the data memory 8 and will be stored therein. If, on the other hand, two or more clock signals occur simultaneously or, as compared with the master clock, in rapid succession, the respective data from the data channels will initially be temporarily be stored in the temporary memories without mutually obstructing one another. In this case, the synchronizing unit 6 receives several retrieval requests simultaneously. However, the synchronizing unit 6 is designed to satisfy these requests successfully in accordance with a predetermined priority pattern and will release the various temporary memories in accordance with a predetermined order. To this end, the synchronizing unit 6 determines the respective residence time of the data in the various temporary memories 1, 2, 3 and first connects the data with the longest residence time through to the sequence control unit 7 and therefore to the data memory 8. The synchronizing unit 6 is designed in such a manner, for example, that it will always first read the data from the temporary memory 1, then the data from the temporary memory 2, and finally the data from the temporary memory 3. If, for example, clock signals occur at a given time simultaneously in the clock channels II and III and consequently the data from the data channels a--x sample at that time are simultaneously stored in the temporary memories 2 and 3, the synchronizing unit 6 will decide that first the data from the temporary memory 2 are transferred to the data memory 8, while the data in the temporary memory 3 remain for another system cycle in the temporary memory 3 before being transferred to the data memory 8. Therefore, the data in the temporary memory 3 have the longer residence time until transfer to the data memory. In the synchronizing unit 6 they are also identified accordingly, i.e. the data from the data channels a--x stored in the temporary memory 3 are supplemented by a few digital signals which given encoded information as to the period for which these data are stored in the associated temporary memory before they are transferred by the synchronizing unit 6 to the data memory 8. It is thereby possible, after termination of the measurement and upon analysis of the data stored in the data memory 8, to reconstruct the initial simultaneity of the data although these were written consecutively into the data memory. Based on criteria determined by the user of the analyzer, the sequence control unit 7 causes storing or non-storing of the data output from the synchronizing unit 6 in the data memory 8, wherein the sequence control unit may, for example, also be controlled via a data word recognition circuit in accordance with the teachings of the German Pat. No. 3,149,460 which is fully incorporated herein by this reference.

As shown, the data channels a--x are connected to the temporary memories 1, 2 and 3 by way of a connection device 10 which supplies the data in parallel to each of the temporary memories 1, 2 and 3.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A logic analyzer for representing the data of a digital circuit which simultaneously provides a plurality of data signals and a plurality of different individual clock signals, comprising:
    a plurality of data channels connected to the digital circuit for simultaneously receiving the data signals;
    a plurality of clock channels connectible to the digital circuit for receiving the individual clock signals;
    a plurality of temporary memories each connected to all of said plurality of data channels and each connected to a respective clock channel for sampling the data signals appearing in said plurality of data channels in response to its respective individual clock signal;
    a master clock generator producing master clock signals;
    analyzing means including a data memory connected to said master clock generator and display means connected to said data memory; and
    control means connected between said plurality of temporary memories and said data memory and connected to and controlled by the master clock signals of said master clock generator to selectively connect said temporary memories through to said data memory in response to the master clock signals.

2. The logic analyzer of claim 1, wherein:
    said control means comprises a synchronizing unit connected to said plurality of temporary memories and connected to said master clock generator and controlled by the master clock signals.

3. The logic analyzer of claim 2, wherein:
    said synchronizing unit comprises means for determining the residence time of data in each of said temporary memories and appending a binary-encoded word indicating residence time upon transfer of data from a temporary memory to said data memory.

* * * * *